US005185552A

United States Patent [19]

Suzuki et al.

[11] Patent Number: 5,185,552

[45] Date of Patent: Feb. 9, 1993

[54] VACUUM ULTRAVIOLET LIGHT SOURCE

[75] Inventors: Setsuo Suzuki, Yokohama; Etsuo Noda, Fujisawa; Osami Morimiya, Tokyo, all of Japan

[73] Assignee: Kabushiki Kaisha Toshiba, Kawasaki, Japan

[21] Appl. No.: 718,978

[22] Filed: Jun. 21, 1991

[30] Foreign Application Priority Data

Jun. 22, 1990 [JP] Japan .............................. 2-162710

[51] Int. Cl.[5] .......................... H01J 7/24; H01J 37/26

[52] U.S. Cl. .......................... 313/231.71; 313/231.61; 315/111.31; 250/493.1; 250/50.4 R

[58] Field of Search ........... 313/231.3, 231.41, 231.51, 313/231.61, 231.71, 362.1; 315/111.11, 111.21, 111.31; 250/493, 504 R

[56] References Cited

U.S. PATENT DOCUMENTS

| | | | |
|---|---|---|---|
| 3,942,018 | 3/1976 | Simpson | 313/231.61 X |
| 4,525,381 | 6/1985 | Tanaka et al. | 427/54.1 |
| 4,707,637 | 11/1987 | Harvey | 315/111.31 X |

FOREIGN PATENT DOCUMENTS 1133572 7/1962 Fed. Rep. of Germany .

OTHER PUBLICATIONS

Soviet Inventions Illustrated, El Section, Week 8637, Oct. 22, 1986, Derwent Publications Ltd., London, GB, S03, p. 22.

Rev. Sci. Instrum. 56(5) pp. 759–761 (1985); J. E. Rowe, S. B. Christman, and E. E. Chaban.

Appl. Phys. Letter 57(18), pp. 1873–1875 (1990); Z. Yu, T. Y. Sheng, Z. Luo, and G. J. Collins.

Appl. Phys. B46, pp. 299–303 (1988); B. Eliasson and U. Kogelschatz.

*Primary Examiner*— Sandra L. O'Shea

*Attorney, Agent, or Firm*—Oblon, Spivak, McClelland, Maier & Neustadt

[57] ABSTRACT

A vacuum ultraviolet light source for generating a pulse discharge in a low pressure gas and extracting ultraviolet light from a plasma created in that discharge, is disclosed which comprises a discharge space P, a plate-like anode located in the discharge space, a plurality of hollow cathodes located in the discharge space in an opposed, spaced-apart relation to the anode, auxiliary electrodes provided in an inside space of the hollow cathode in a state shielded from the hollow cathode, means which, while maintaining a pressure in the discharge space constant, flows a gas along a route in the discharge space after passing through an inner space in each hollow cathode, a power supply for supplying an electric power for generating a main discharge across the hollow cathode and the anode after a pre-discharge is produced across each hollow cathode and the anode, and ultraviolet extracting means for extracting ultraviolet light radiated from a plasma which is produced by a discharge in the discharge space.

7 Claims, 9 Drawing Sheets

VACUUM ULTRAVIOLET LIGHT SOURCE

BACKGROUND OF THE INVENTION

1. Field of the Invention

The present invention relates to a vacuum ultraviolet (VUV) light source for generating an ultraviolet light by utilizing radiation light originating from a discharge plasma.

2. Description of the Related Art

In the case where an amorphous silicon thin film is formed through the direct dissociation of $SiH_4$ by light, is necessary to use vacuum ultraviolet light.

A so-called $\pi$-type discharge tube as shown in FIG. 10 is well known as a light source for generating vacuum ultraviolet light having a wavelength of below 180 nm.

This type of vacuum ultraviolet light source includes a cylindrical discharge tube 1 and a pair of electrodes 2 and 3 are located in the discharge tube in a spaced-apart relation. A window 4 is provided on one side end of the discharge tube 1 to take out ultraviolet light. A coolant passage 5 is provided outside the discharge tube 1 to allow a flow of a coolant. The discharge tube 1 has its inside adequately evacuated and a rare gas, hydrogen or denterium, is filled in the discharge tube 1 to an extent that a predetermined pressure can be maintained in the discharge tube. A power supply 6 supplies a power necessary for a discharge as generated between the electrodes 2 and 3. The power supply 6 charges a storage capacitor 8 through a DC power supply 7 and a switch 9 are used to apply pulse voltage to the electrodes 2 and 3.

When the pulse voltage is applied across the electrodes 2 and 3, a pulse discharge is generated across the electrodes 2 and 3 to radiate ultraviolet light through a plasma involved. The ultraviolet light is taken out from the window 4.

The conventional vacuum ultraviolet light source thus arranged poses the following problem. That is, in order to obtain high-output ultraviolet light, a high current density discharge is required for a current of quick rise time and high peak. In the aforementioned conventional light source a high current level results in an unstable discharge. It is, therefore, not possible to stably maintain the high-density discharge. Since, in the conventional light source, a discharge plasma cannot stably be created in a broader discharge space in a spatially uniform fashion, a corresponding ultraviolet light beam diameter is relatively small on the order of about 30 mm, largely restricting the application range of the light source.

In the conventional vacuum ultraviolet light source, therefore, the radiation efficiency and power output of the vacuum ultraviolet light are low and, therefore, it has been difficult to achieve a large-diameter ultraviolet light beam.

SUMMARY OF THE INVENTION

It is accordingly the object of the present invention to provide a vacuum ultraviolet light source which ensures a high radiation efficiency, a high power-output and a long service life and can obtain a large-bore ultraviolet light.

In order to achieve the object of the present invention there is provided a vacuum ultraviolet light source for generating a pulse discharge in a low pressure gas and extracting ultraviolet light from a plasma created in that discharge, characterized by a discharge space P;

a plate-like anode located in the discharge space;

a plurality of hollow cathodes located in the discharge space in an opposed, spaced-apart relation to the anode;

auxiliary electrodes provided in an inside space of the hollow cathode in a state shielded from the hollow cathode;

means which, while maintaining a pressure in the discharge space constant, flows a gas along a route in the discharge space after passing through an inner space in each hollow cathode;

a power supply for supplying an electric power for generating a main discharge across the hollow cathode and the anode after a pre-discharge is generated across each hollow cathode and the anode; and ultraviolet extracting means for extracting ultraviolet light radiated from a plasma which is generated by a discharge in the discharge space.

In order to extract a large-bore ultraviolet light, it is required that a broader discharge plasma generation area is secured in the discharge space. It is, therefore, necessary to take up a larger electrode area. The broader electrode area causes a discharge plasma to be generated in a spatially uniform fashion and hence in an unsteady fashion. This leads to a drop in the output and in radiation energy efficiency of the ultraviolet light.

In the light source of the present invention, the cathode side is comprised of at least a plurality of cathodes isolated in a DC made from the standpoint of its associated circuit. These cathodes so arranged can produced a discharge plasma in a broader discharge space in a spatially uniform, stable fashion. It is also possible to obtain a large-bore ultraviolet light. Since the cathode side is comprised of the plurality of hollow cathodes, it is possible to achieve the readiness with which a discharge is made stable and to improve the radiation energy efficiency and increase an output value involved. According to the present invention, a predischarge is generated between the respective hollow cathode and the auxiliary electrode in the hollow cathode and shifted to a main-discharge. For this reason, the rise time of current discharge can be decreased. In general, in order to extract vacuum ultraviolet light from the discharge plasma, it is required that a greater discharge by a peak current be generated for a brief rise time. Let it be supposed that, for example, light whose wavelength is 147 nm, i.e., a resonant line of vacuum ultraviolet light (cf. xenon gas), is extracted from the discharge plasma. Since, in this case, the excited energy of the resonant line is 8.4 eV, it is necessary to speed up the excited rate of the resonant line, by increasing the mean electron energy, and to increase the excited atom density. A discharge with a fast rise time and high current is, therefore, effective. At a current rise time in particular, a higher ionization rate is involved due to a high average energy of electrons present. A rise time of the current is desirable for as brief a period as possible. Upon being studied by experiment, a pulse current width for a discharge may be of the order of 1 microsecond. A pre-discharge across the respective hollow cathode and the associated auxiliary electrode contributes to a shortening of a main current rise time. A continued large current causes a shift from a glow discharge mode to an arc discharge mode, causing a lowering in the mean electron energy and hence in the excitation rate. If a discharge is stopped prior to the generation of an arc discharge, a discharge power is dissipated as a waste electric power in the case of a vacuum ultraviolet light radiation and causes a lowering in the radiation energy efficiency. Generally, the period of time in which a shift is effected from a glow discharge mode to an arc discharge mode is of the order of 0.1 to 1 μs, depending upon the kinds of gases and upon the gas pressure. It is, therefore, required that the pulse discharge current width is within 1 μs at the longest. Suppressing the pulse discharge current width within the time period as set out above can be accomplished by using the circuit-wise.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
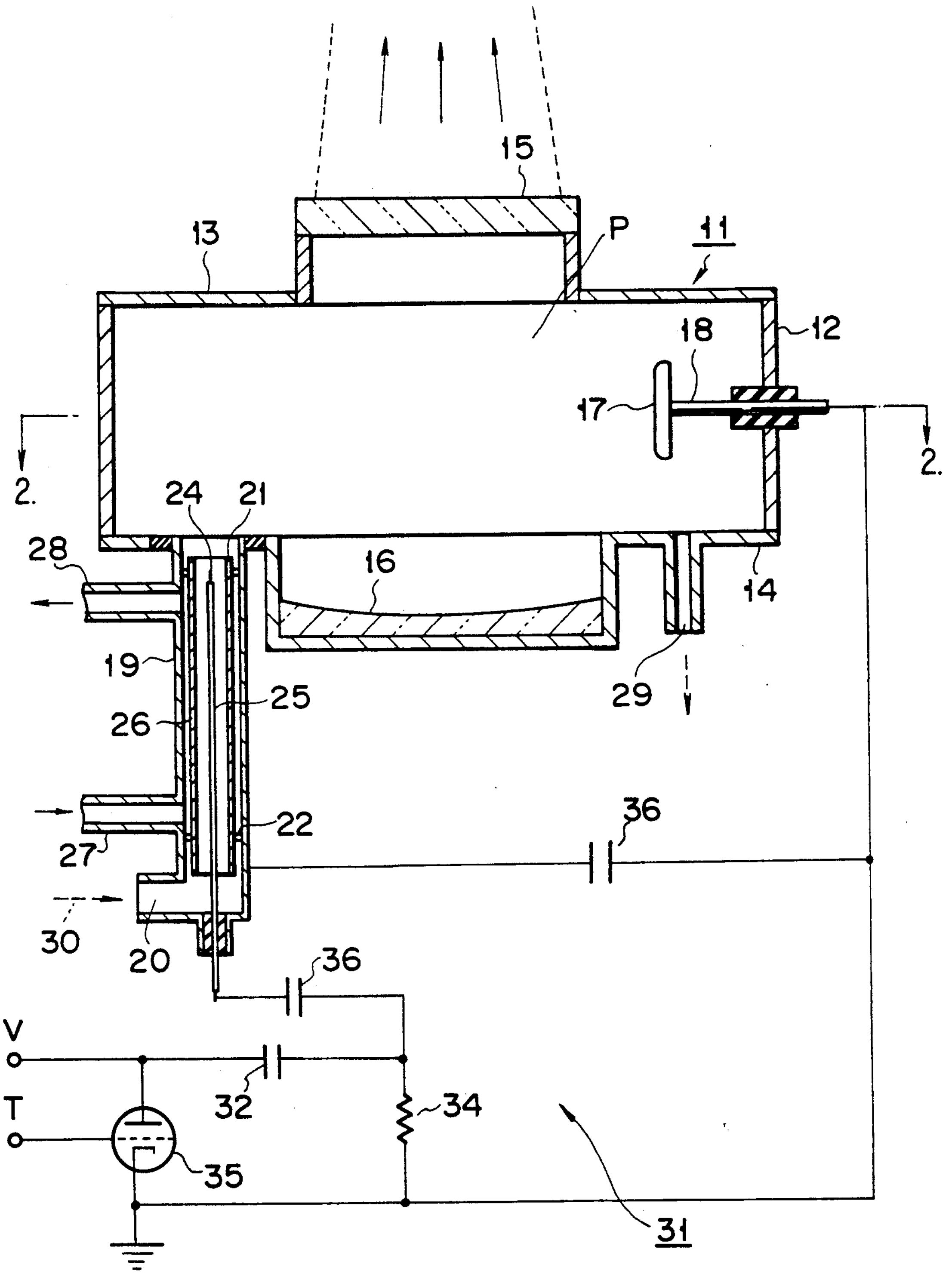
FIG. 1 is a diagrammatic view, partly in section, showing a vacuum ultraviolet light source according to one embodiment of the present embodiment and its associated connection.

FIG. 1 is a schematic arrangement showing a vacuum ultraviolet light source according to one embodiment of the present invention.

The light source of the present invention includes a container 11 defining a discharge space P therein. The container 11 includes a cylindrical wall 12 and a pair of opposed walls 13 and 14 for hermetically closing a pair of open ends of the cylindrical wall 12. An upwardly recessed section is provided at the center of the closed wall 13 in a discharge space P as seen from the axis of the cylindrical wall 12.

A window 15 is provided as a wall of the recessed section and made of a material, magnesium fluoride, lithium fluoride and calcium fluoride. A downwardly recessed section is provided in the discharge space in an opposed relation to the window 15 of the upwardly recessed section 14 as viewed in the axis of the cylindrical wall 12. A reflecting mirror 16 is located in an opposed relation to the window 15.

A plate-like anode 17 is located on the right-side space zone with the reflecting mirror 16 as a reference.

Figure 2:
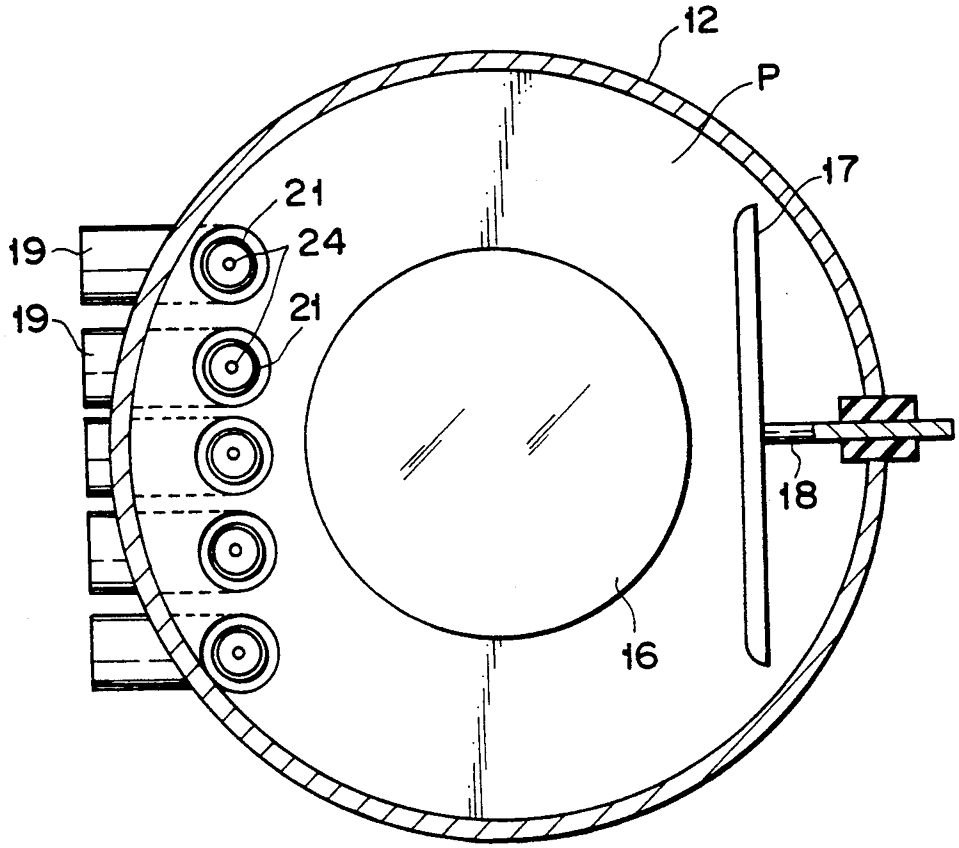
FIG. 2 is a cross-sectional view, taken along line A—A as viewed in a direction of arrows in FIG. 1.

As shown in FIG. 2, the anode 17 extends in a direction perpendicular to the axis of the cylinder wall 12. One end of a conductive rod 18 is connected to a center or near-center area of the back surface of the anode 17 and the other end portion of the conductive rod 18 is mounted on the cylindrical wall 12 in an insulatively, air-tight fashion and ultraviolet light originating from a discharge is directed through the window 15 to an outside.

Five holes (see FIG. 2) are provided, as a parallel array, in the marginal edge portion of the closed wall 14 along those lines parallel with the longitudinally extending surface of the anode 17. Cylinders 19 . . . are hermetically connected at one end to the inner edges of the five holes in a one-to-one correspondence. The other end portion of each cylinder 19 extends downwardly as shown in FIG. 1 in a direction parallel to the axis of the cylindrical wall 12 is U-bent and has its extreme end connected to a gas supply source, not shown.

A hollow cathode 21 is mounted in the cylinder 19 in the neighborhood of the closed wall 14 and fixed by a support member 22 to the inner surface of the cylinder 19 such that its end on the discharge space P side is retracted a predetermined distance from a boundary to that discharge space P.

A auxiliary electrode 24 is provided within the hollow cathode 21 in a manner to be located concentric with the hollow cathode 21. The auxiliary electrode 24 is shielded by an insulation 25 on its outer peripheral surface with only the upper end portion exposed as shown in FIG. 1. The lower end portion of the respective auxiliary electrode 24 extends, in an insulatively, airtight fashion, through the peripheral wall of the cylinder 19 to an outside as shown in FIG. 1.

A coolant passage 26 is defined by the support member 22, the outer peripheral surface of the hollow cathode 21 and the inner surface of the cylinder 19 and connected to coolant conducting tubes 27 and 28. The coolant conducting tubes 27 and 28 are connected to a coolant supply source, not shown.

A gas exhaust tube 29 is provided near the closed wall 14 at an area opposed to the anode 17. In the light source of the present invention, a working gas is supplied to each cylinder 19 as indicated by a broken arrow 30 in FIG. 1. The gas flows past the corresponding hollow cathode 21 into the discharge chamber P and exhausted via the gas exhaust tube 29 top an outside. In the present embodiment, a gas supply system utilizes a mixed gas containing a helium gas of over 90% and xenon gas of below 10%. The mixed gas is continuously supplied to the discharge chamber P, while maintaining a pressure in the discharge space P at a predetermined pressure.

The anode 17, hollow electrode 21 and auxiliary electrode 24 are connected to a corresponding power supply 31. In a power supply 31, a series combination of a storage capacitor 32 and resistor 34 is connected across the output terminals of a DC power supply, not shown, and a thyratron switch 35 is connected across both terminals of the series combination of the capacitor 32 and resistor 34. A junction of the thyratron switch 35 and resistor 34 is connected to the anode 17 and to the hollow electrode 21 through a peaking capacitor 36 whose capacitance is smaller than that of the storage capacitor 32. A junction of the storage capacitor 32 and resistor 34 is connected, the capacitor 36 smaller than the capacitor 32, is connected to the auxiliary electrode 24K, to the associated hollow electrode 21. The thyratron switch 35 is of such a type that it receives a trigger signal T which synchronizes with a charging cycle.

The operation of the present embodiment thus constructed will be explained below.

First, the discharge space P of the container 11 is adequately exhausted by a vacuum pump (not shown) and a working gas is supplied from a gas supply device (not shown) into the discharge space. The working gas flows into the discharge space P through the hollow cathode 21 and exhausted via the gas discharge tube 29. A coolant, such as water, flows from the coolant supply device into the coolant passage 26.

With the DC power supply, not shown, ON, the storage capacitor 32 is charged in a responant fashion. The trigger signal T is applied by a predetermined timing to the thyratron switch 35. With the thyratron switch 35 ON, a discharge occurs across the auxiliary electrode 24 and the hollow cathode 21 and the peaking capacitor 36 is charged. As a result, a "glow discharge" occurs across the anode 17 and the hollow cathode 21 and a plasma is produced in the discharge space P due to the generation of the discharge. Some VUV light radiated from the plasma is directed directly toward the window 15 and some VUV light is reflected back from the reflecting mirror 16 and directed toward the reflecting mirror 15. The VUV light is radiated from the window 15 toward an outside.

Since, in this case, the cathode side is comprised of a plurality of hollow cathodes 21 separated in a DC mode, it is possible to spatially uniformly create a discharge plasma in a broader discharge space in stable fashion and to obtain a VUV light of larger diameter.

Figure 8:
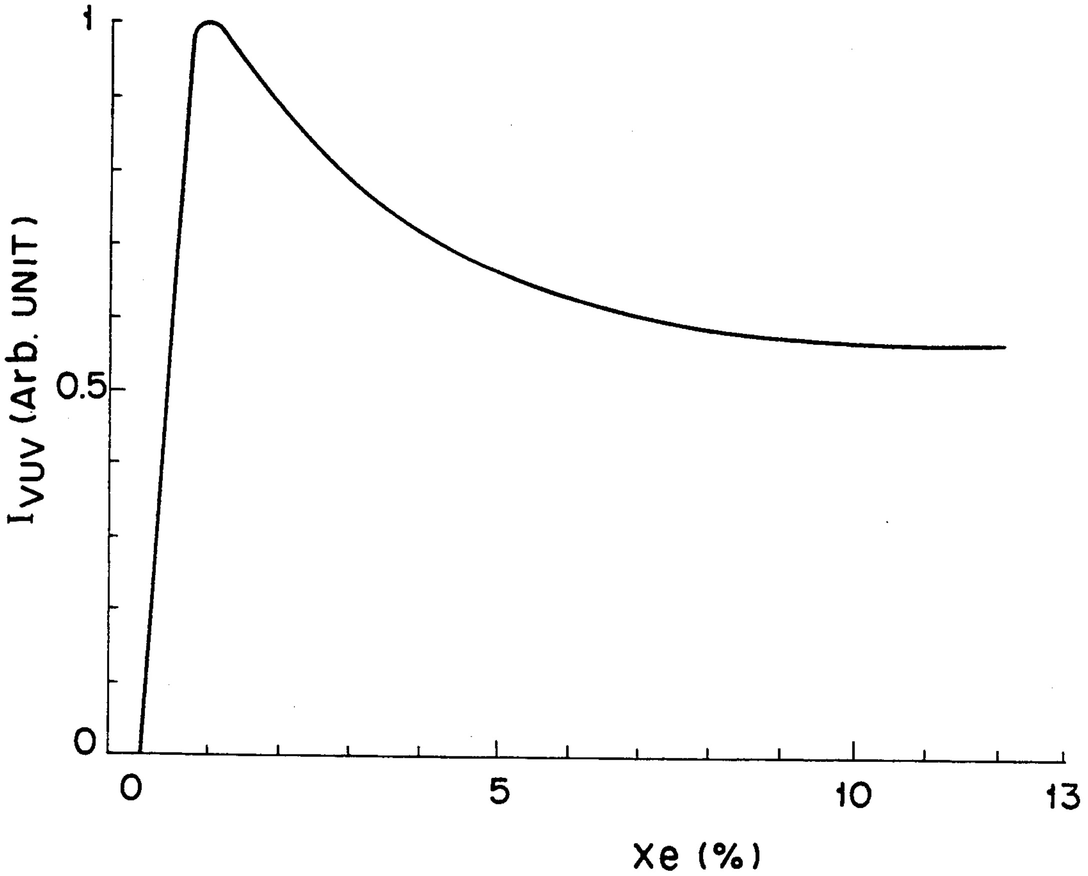
FIG. 8 is a graph showing a relation of a ratio of a xenon gas in a helium gas to the intensity of vacuum ultraviolet light whose wavelength is 147 nm.

Since the cathode side is comprised of the plurality of hollow cathodes 21, it is easier to stabilize a discharge. As a result, it is possible to improve the radiation energy efficiency and hence a power output. That is, the stability of the hollow cathode discharge depends upon the kind and pressure of a gas as well as the shape of electrodes. As shown in FIG. 8, if about a greater-than 90% is added to a xenon gas, it is possible to achieve the stability of the hollow cathode discharge. It has been experimentally confirmed that, for about several percent of a xenon gas (Xe), the radiation intensity of the VUV light whose wavelength is 147 nm is maximal in level.

Figure 9:
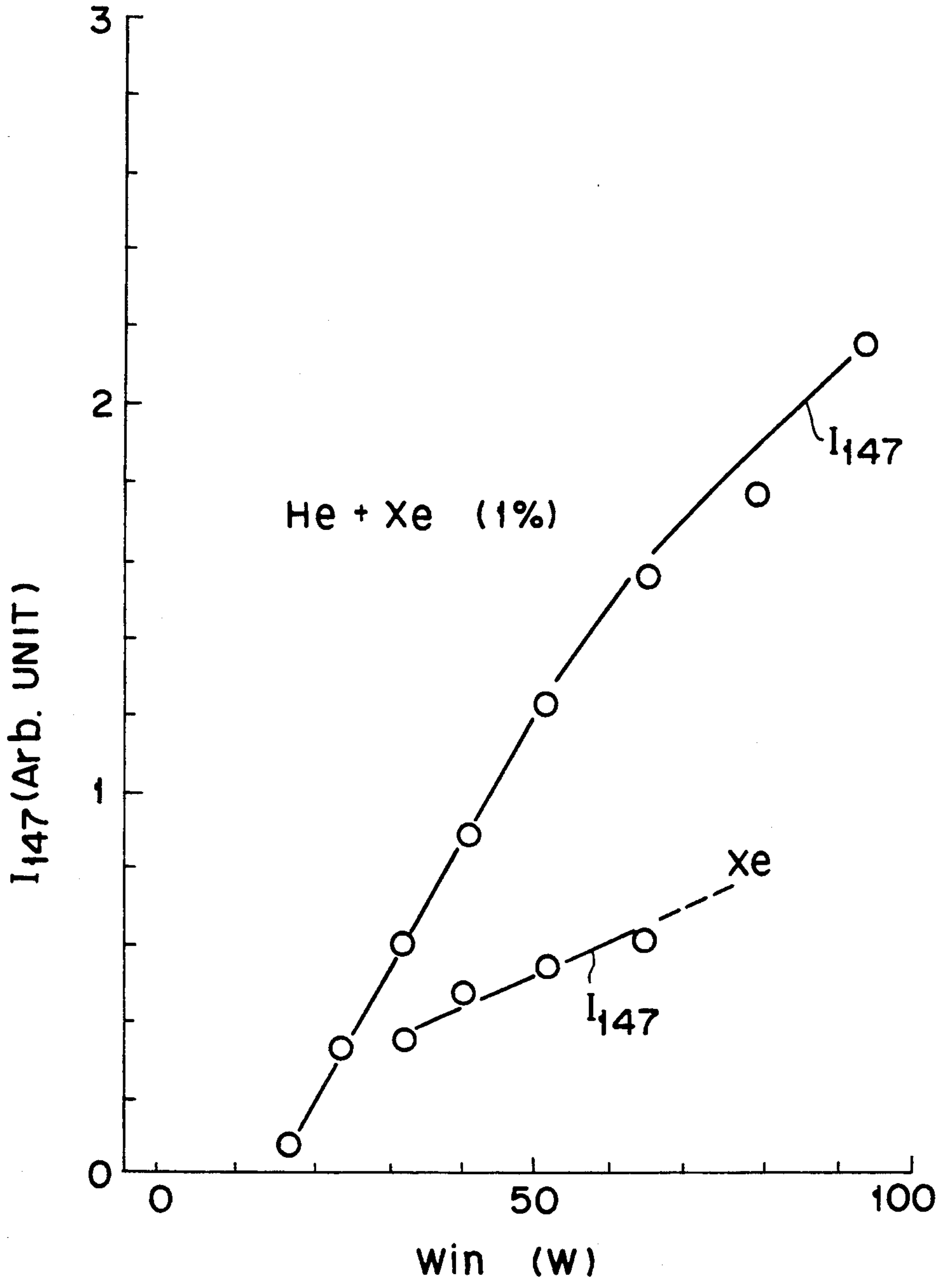
FIG. 9 is a graph showing a relation of an input power to the radiation strength of vacuum ultraviolet light whose wavelength is 147 nm.
Figure 10:
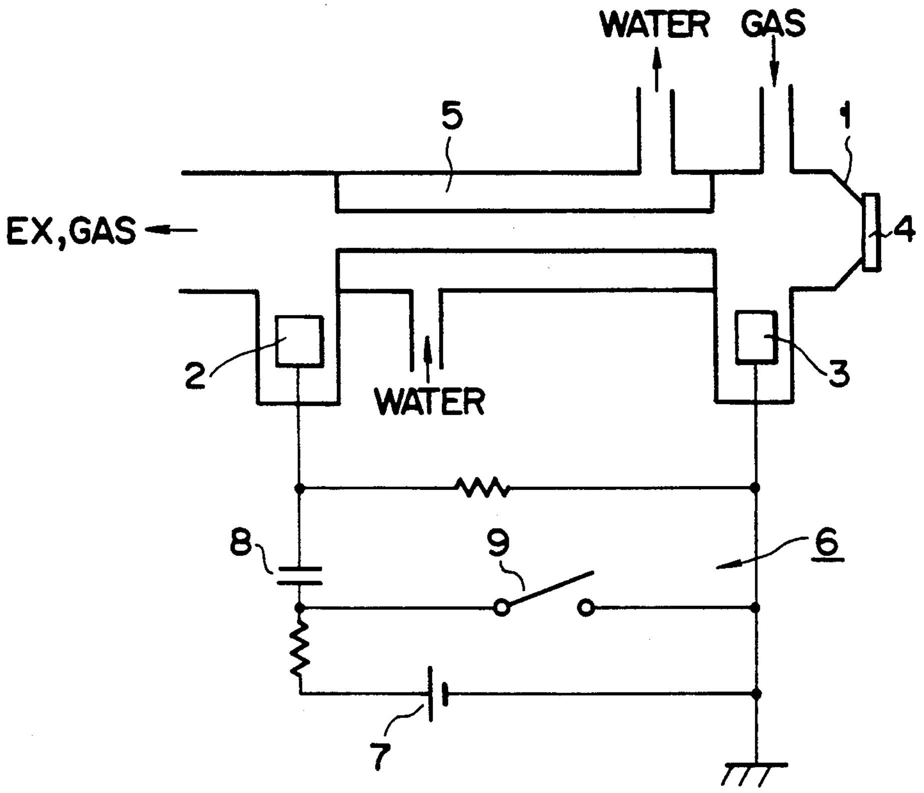
FIG. 10 is a schematic view showing a major part of a conventional vacuum ultraviolet light source.

FIG. 9 is a graph showing a comparison in the radiation intensity of the VUV light of a wavelength 147 nm for about 1% of a xenon (Xe) gas and 100% of a xenon gas. It has been found that, upon comparison of the two at an input power of 50 W, the radiation intensity of the VUV light of wavelength 147 nm for about 1% of a xenon gas shows an increase of about 2.5 times. Further, upon comparison of their discharge powers at that time, a discharge becomes unsteady at about 60 W for 100% of a xenon gas and the power output becomes unavailable. It has been found that, at about 1% of a xenon gas, at least a greater-than 3 times the power input is available. It has been found, therefore, that at least a greater-than 90% of a helium gas may be mixed in order to stably carry out a hollow cathode discharge at a high electric power density.

Further, the auxiliary electrode 24 is provided for the respective hollow cathode 24. After a pre-discharge is done across the hollow cathode 21 and the auxiliary electrode 24, a shift to a main discharge is made in a controllable mode. It is, therefore, possible to shorten a rise time of the discharge current.

In the case where the window 15 is located in a direction away from the center point of the discharge chamber P as in the present embodiment, it is possible to suppress the material of the window 15 from being damaged by the charged particles in a plasma and hence ensure a light source of a longer service life. Further, if the reflecting mirror 16 is located in an opposed relation to the window 15, as shown in FIG. 1, with the created plasma as a boundary as in the present embodiment, the radiation loss can be reduced, achieving an increased output. In the case where the reflecting mirror 16 is located in a direction away from the center point of the discharge chamber P as in the present embodiment, it is possible to suppress the member of the reflecting mirror 16 from being damaged by the charged particles of the plasma and hence to ensure a light source of a longer service life.

Since the forward end of the hollow cathode 21 is retracted back from a boundary to the discharge chamber P, it is possible to prevent electrode material particles which are knocked out by a sputtering from entering into the discharge space P and hence a drop in the electron temperature and in the excitation rate and prevent a drop in the level of a radiation of VUV light.

As in the present embodiment, the power supply 31 is comprised of a variable-capacity type pulse circuit and the light source of the present embodiment can be made compact as a whole. A decrease in the capacitance of the peaking capacitor can narrow a pulse width obtained and improve the lighting efficiency of the light source.

Figure 3:
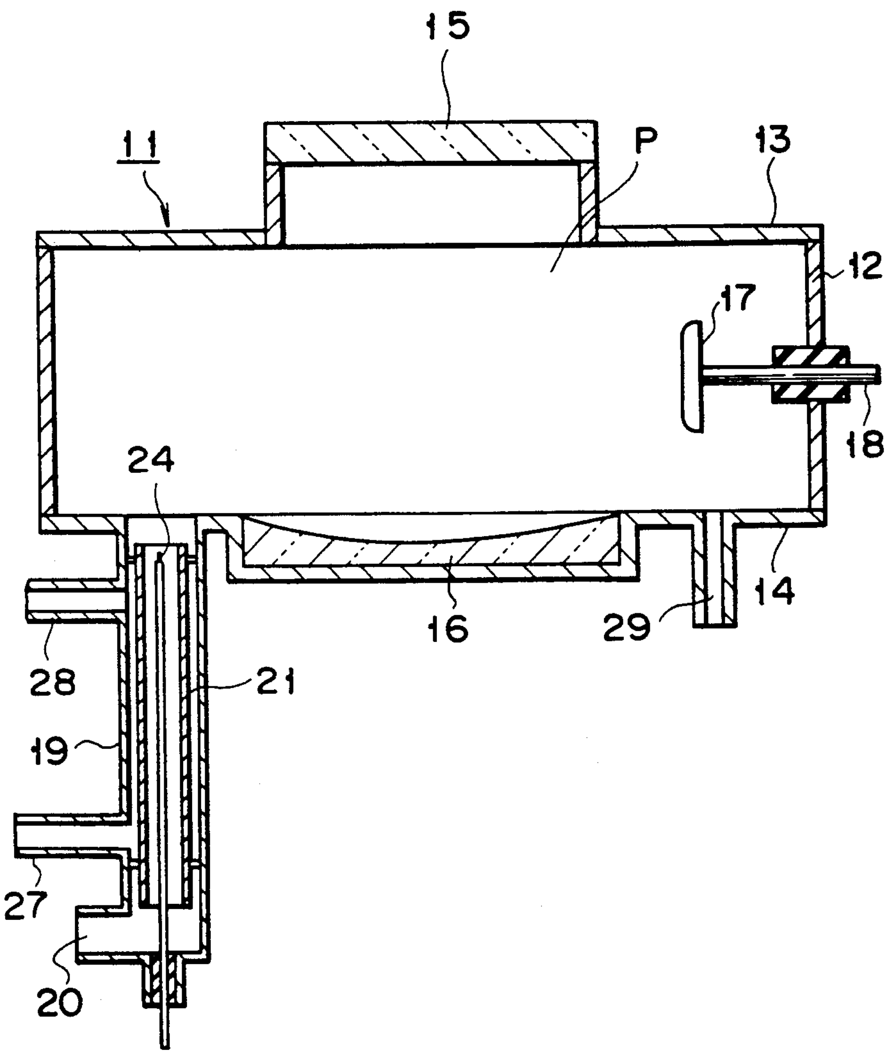
FIGS. 3 to 7 are cross-sectional views showing a variant of the vacuum ultraviolet light source.
Figure 4:
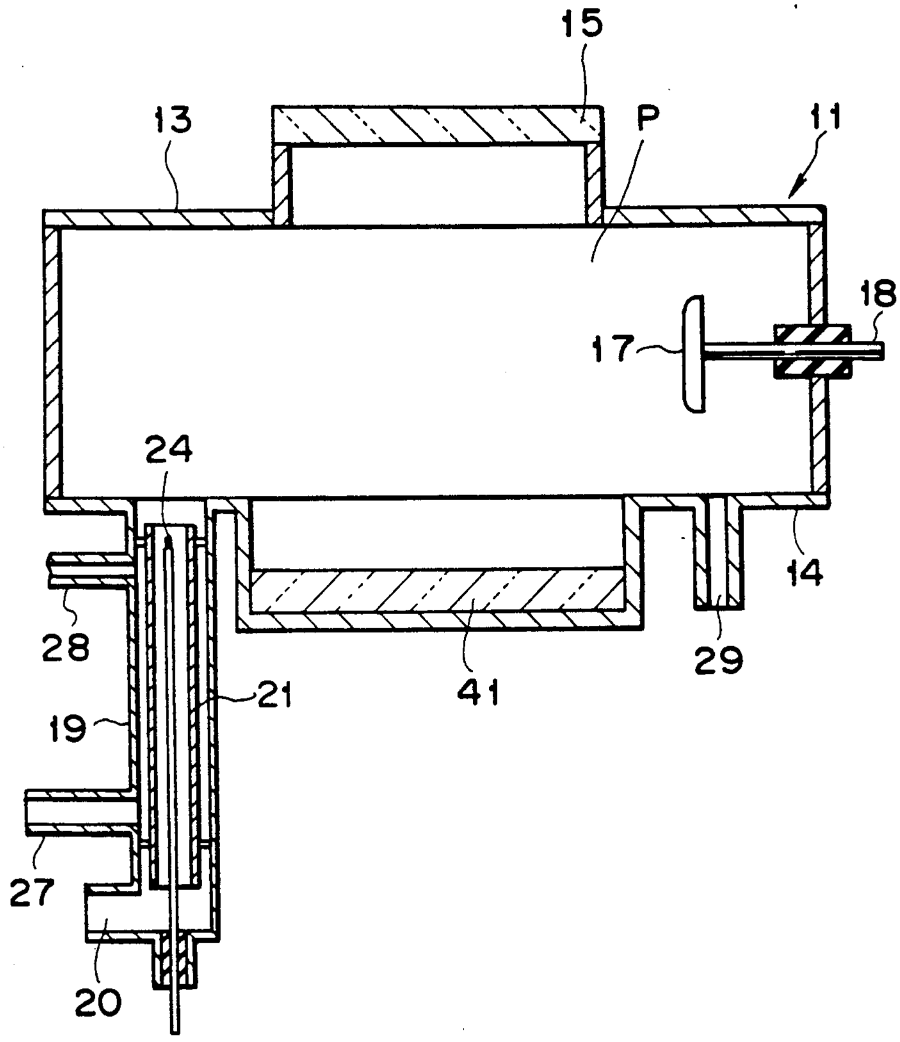

The present invention is not restricted to the aforementioned embodiment and various changes and modifications of the present invention can be made without deviating from the present invention. As shown in FIG. 3, for example, the reflecting mirror 16 may be so arranged as to make its marginal edge flush with the inner surface of the closed wall 14. Not only the reflecting mirror but also a flat type reflecting mirror 41 may be made as shown in FIG. 4.

Figure 5:
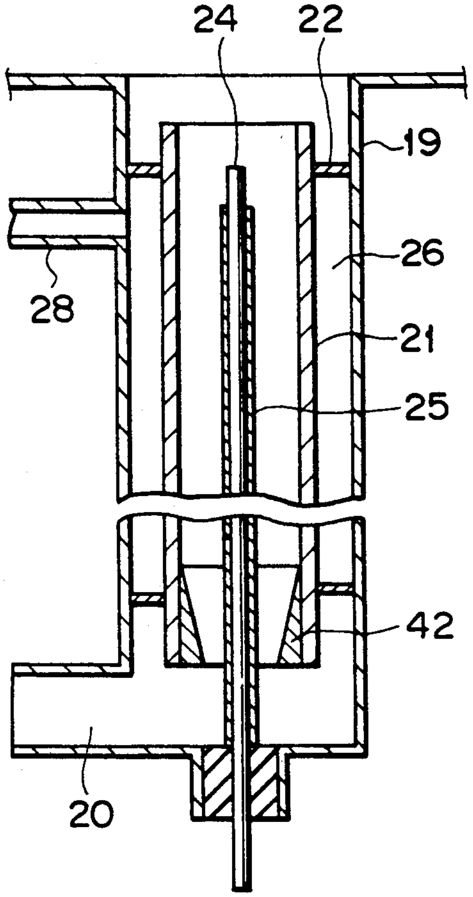
Figure 6:
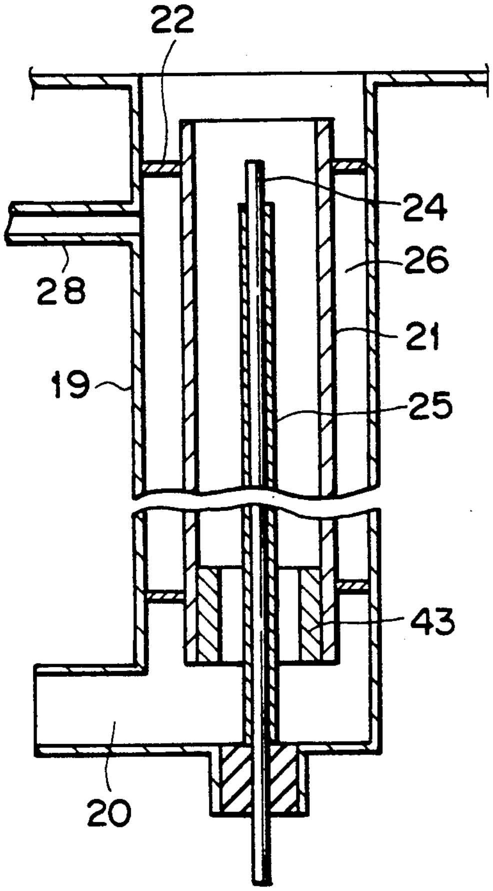
Figure 7:
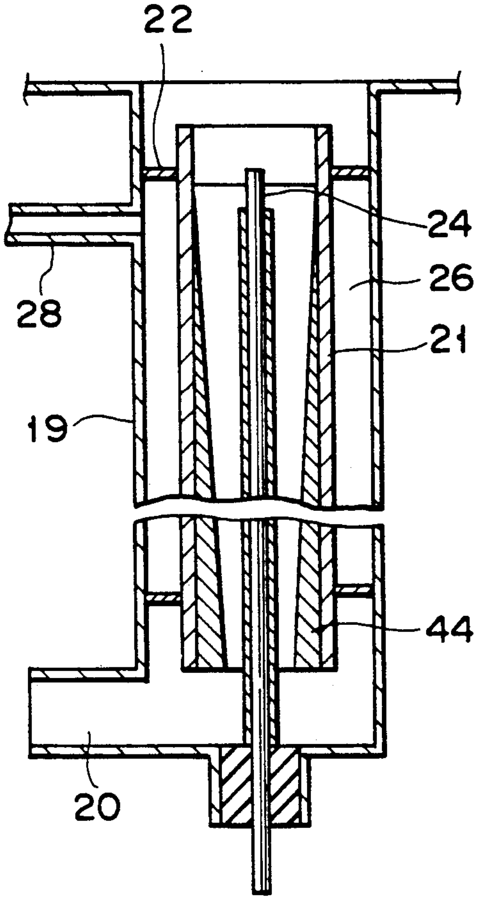

In order to prevent an increase in energy loss at the cathode resulting from the movement of a cathode glow toward an upstream side (for example, a gas pipe line) of the hollow cathode 21 and prevent a drop in the radiation energy efficiency, sub-rings 42, 43 and 44 may be mounted on the upstream side of the hollow cathode 21 with their inner diameter reduced to several millimeters as shown in FIGS. 5, 6 and 7 to allow a plasma to be confined in the hollow cathode 21 to a possible maximum extent.

The hollow cathode is not restricted to a cylindrical configuration in particular and may be made a polygonal cylinder. The hollow cathodes are not restricted in number to five. The anode may be of a split type.

The working gas is not restricted only to a mixed gas containing a greater-than 90% of helium gas in a xenon gas. Even if a mixed gas is employed which is composed of a combination of two kinds of rare gases selected from the group consisting of helium, neon, argon, Krypton and xenon, it is possible to achieve a stable, hollow cathode discharge when a greater-than 90% gas is contained as a highest ionization voltage gas. Thus VUV light can effectively be extracted from a resonant "rare gas" line. The same effect can also be gained even if use is made of a combination of the rare gas with another gas, such as nitrogen, oxygen and hydrogen.

Various changes or modifications of the present invention can be made without departing from the spirit and scope of the present invention. In order to prevent the diffusion of a discharge in the discharge space, for example, a partition wall can be provided to confine such a discharge.

The forward end portion of the hollow cathode on the discharge space side may be provided in a manner to extend out from the wall surface of the discharge space.

Thus the present invention can achieve a large-bore, large output-power VUV light source of high efficiency and long service life.

Additional advantages and modifications will readily occur to those skilled in the art. Therefore, the invention in its broader aspects is not limited to the specific details and representative devices, shown and described herein. Accordingly, various modifications may be made without departing from the spirit or scope of the general inventive concept as defined by the appended claims and their equivalents.

What is claimed is:

1. A vacuum ultraviolet light source for generating a pulse discharge in a low pressure gas and extracting ultraviolet light from a plasma created in that discharge, characterized by

- a discharge space;
- a plate-like anode located in the discharge space;
- a plurality of hollow cathodes located in the discharge space in an opposed, spaced-apart relation to the anode;
- auxiliary electrodes provided in an inside space of the hollow cathode in a state shielded from the hollow cathode;
- gas flowing means which, while maintaining a pressure in the discharge space constant, flows a gas along a route in the discharge space after passing through an inner space in each hollow cathode;
- a power supply for supplying an electric power for generating a main discharge across the hollow cathode and the anode after a pre-discharge is generated across each hollow cathode and the anode; and
- ultraviolet light extracting means for extracting ultraviolet light radiated from a plasma which is generated by a discharge in the discharge space.

2. The vacuum ultraviolet light source according to claim 1, wherein said ultraviolet light extracting means comprises an ultraviolet light window constituting part of a wall of the discharge space and a reflecting mirror located in the discharge chamber in an opposed relation to the window.

3. The vacuum ultraviolet light source according to claim 1, wherein said hollow cathode is located in a manner to extent out from a plane of a wall surface of the discharge chamber.

4. The vacuum ultraviolet light source according to claim 1, wherein the hollow cathode is so formed as to have a diameter which is substantially smaller on its upstream side than on its downstream side.

5. The vacuum ultraviolet light source according to claim 1, wherein the auxiliary electrode is shielded with an insulation except at its forward end portion situated on a discharge space side.

6. The vacuum ultraviolet light source according to claim 1, wherein said gas flowing means supplies a mixed gas into the discharge chamber, said mixed gas being composed of a combination of two or more gases at least containing a rare gas, the rare gas being contained in a range of over 85 percent and having a highest ionization voltage.

7. The vacuum ultraviolet light source according to claim 1, wherein a partition wall is located in the discharge space between the plate-like anode and the hollow cathodes and has a hole of predetermined size in a position parallel with the ultraviolet light window to confine a discharge generated.

* * * * *